United States Patent

Razavi et al.

(10) Patent No.: US 10,135,576 B2
(45) Date of Patent: Nov. 20, 2018

(54) RATELESS ENCODING

(71) Applicant: Alcatel Lucent, Boulogne-Billancourt (FR)

(72) Inventors: Rouzbeh Razavi, Dublin (IE); Holger Claussen, Dublin (IE)

(73) Assignee: Alcatel Lucent, Boulogne-Billiancourt (FR)

( * ) Notice: Subject to any disclaimer, the term of this patent is extended or adjusted under 35 U.S.C. 154(b) by 4 days.

(21) Appl. No.: 14/895,633

(22) PCT Filed: Jun. 5, 2014

(86) PCT No.: PCT/EP2014/001537
§ 371 (c)(1),
(2) Date: Dec. 3, 2015

(87) PCT Pub. No.: WO2015/007357
PCT Pub. Date: Jan. 22, 2015

(65) Prior Publication Data
US 2016/0127082 A1  May 5, 2016

(30) Foreign Application Priority Data

Jul. 15, 2013 (EP) .................... 13306005

(51) Int. Cl.
H04L 1/00 (2006.01)
H04L 1/16 (2006.01)
H03M 13/37 (2006.01)

(52) U.S. Cl.
CPC ...... H04L 1/1621 (2013.01); H03M 13/3761 (2013.01); H04L 1/0002 (2013.01);
(Continued)

(58) Field of Classification Search
CPC ......... H04L 1/18; H04L 1/803; H04L 1/0042; H04L 1/1816; H04L 1/0014; H04L 1/0056; H04L 1/0057
See application file for complete search history.

(56) References Cited

U.S. PATENT DOCUMENTS 4,718,066 A * 1/1988 Rogard .............. H04B 7/18513
714/751
2006/0251105 A1* 11/2006 Kim ...................... H04L 1/1685
370/449
(Continued)

FOREIGN PATENT DOCUMENTS

CN 102684824 A 9/2012
EP 2234304 A1 9/2010

OTHER PUBLICATIONS

International Search Report PCT/ISA/210 for International Application No. PCT/EP2014/001537 dated Aug. 19, 2014.
(Continued)

*Primary Examiner* — Andrew W Chriss
*Assistant Examiner* — Kenan Cehic
(74) *Attorney, Agent, or Firm* — Harness, Dickey & Pierce, P.L.C.

(57) ABSTRACT

A receiver node is operable to receive rateless encoded data packets from a transmitter node. The receiver node includes estimation logic operable to estimate a transiting number of rateless encoded data packets transiting between the receiver node and the transmitter node; determining logic operable to determine an acknowledgement number of received rateless encoded data packets, the acknowledgement number of received rateless encoded data packets including a difference between a decoding number of rateless encoded data packets estimated to be required from a batch of rateless encoded data packets to decode the rateless encoded data packets from the batch and the transiting number of rateless encoded data packets; and acknowledgement logic operable to transmit an acknowledgement to the transmitter node to cause the transmitter node to cease transmission of rateless encoded data packets from the batch of rateless encoded data packets when a received number of received rateless encoded data
(Continued)

packets from the batch of rateless encoded data packets achieves the acknowledgement number of received rateless encoded data packets.

13 Claims, 6 Drawing Sheets

(52) U.S. Cl.
CPC ............ *H04L 1/005* (2013.01); *H04L 1/0047* (2013.01); *H04L 1/0058* (2013.01)

(56) References Cited

U.S. PATENT DOCUMENTS

| | | | |
|---|---|---|---|
| 2010/0054164 A1* | 3/2010 | Lucani | H04L 1/0041 370/294 |
| 2011/0250919 A1* | 10/2011 | Barbieri | H04L 1/0026 455/509 |
| 2012/0246538 A1* | 9/2012 | Wu | H03M 13/3761 714/752 |
| 2015/0236837 A1* | 8/2015 | Kwon | H04L 5/0055 370/329 |
| 2017/0075762 A1* | 3/2017 | Hendrickson | G06F 11/1076 |

OTHER PUBLICATIONS

Michael Luby, "LT Codes", Digital Fountain Inc., Proceedings of the 43$^{rd}$ Annual IEEE Symposium on Foundations of Computer Science (FOCS '02).

* cited by examiner

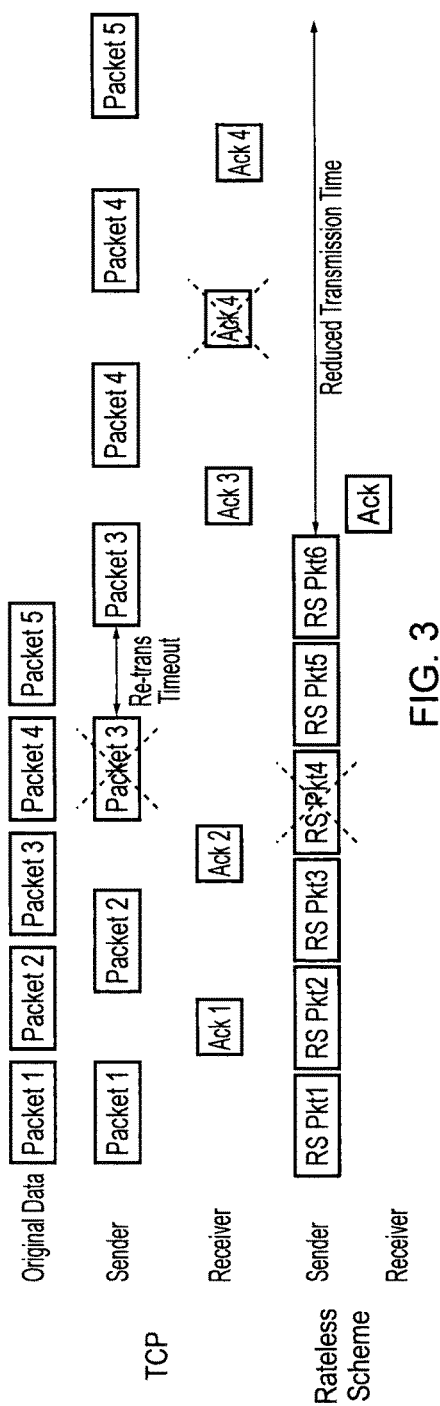
FIG. 3
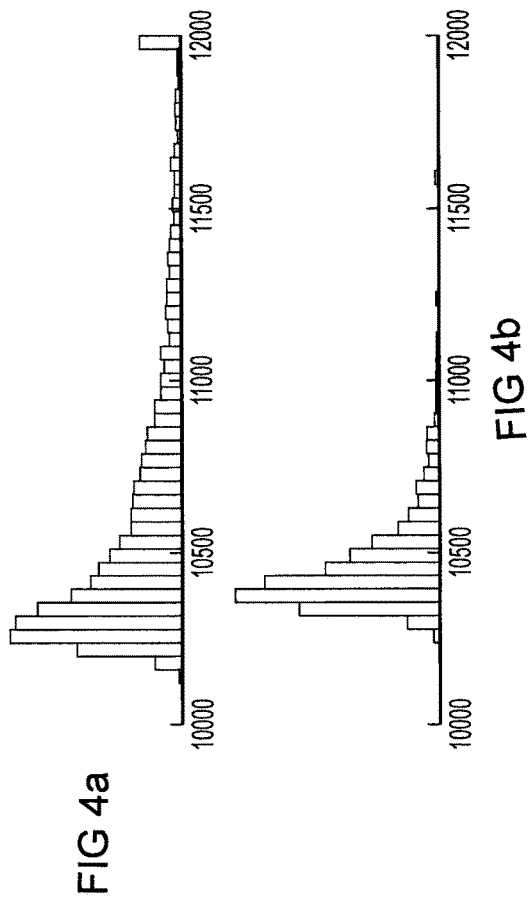
FIG 4a
FIG 4b

RATELESS ENCODING

CROSS-REFERENCE TO RELATED APPLICATIONS

This is a National Phase of PCT Patent Application No. PCT/EP2014/001537, filed on Jun. 5, 2014, and claims priority to, European Application No. 13306005.3, filed Jul. 15, 2013, the contents of each of which are hereby incorporated by reference in their entirety.

FIELD OF THE INVENTION

The present invention relates to a receiver node, a transmitter node, methods and a computer program product.

BACKGROUND

Communications networks exist for the transfer of data between nodes of the network. Communications links are provided between the nodes of the network over which the data between network nodes is transferred. Different protocols exist which define how the data is transferred between the network nodes over the communications links. Various different classifications of nodes exist which may be deployed. Although such networks enable the transfer of data between nodes, unexpected consequences can occur. Accordingly, it is desired to provide an improved technique for transferring data between nodes.

US 2012/0246538 discloses a method of applying rateless fountain codes to symbols of content delivered via a mobile network at one of a transport layer and an application layer. The encoder takes a block of data and keeps generating encoded symbols until a predetermined time or data quantity is reached or until explicit feedback is received indicating the mobile terminal has received sufficient data.

SUMMARY

According to a first aspect, there is provided a receiver node operable to receive rateless encoded data packets from a transmitter node, the receiver node comprising: estimation logic operable to estimate a transiting number of rateless encoded data packets transiting between the receiver node and the transmitter node; determining logic operable to determine an acknowledgement number of received rateless encoded data packets, the acknowledgement number of received rateless encoded data packets comprising a difference between a decoding number of rateless encoded data packets estimated to be required from a batch of rateless encoded data packets to decode the rateless encoded data packets from the batch and the transiting number of rateless encoded data packets; and acknowledgement logic operable to transmit an acknowledgement to the transmitter node to cause the transmitter node to cease transmission of rateless encoded data packets from the batch of rateless encoded data packets when a received number of received rateless encoded data packets from the batch of rateless encoded data packets achieves the acknowledgement number of received rateless encoded data packets.

The first aspect recognises that latency is considered a major concern when it comes to adoption of cloud services. Additionally, the lack of suitable quality of service (QoS) mechanisms and network underutilisation despite of traffic demands results in delay in deployment of cloud-based services. Transmission Control Protocol (TCP) is currently considered as the main transport protocol. According to a research study by the Cooperative Association for Internet Data Analysis (CAIDA), TCP carries more than 89% of the total traffic world-wide. However, TCP's performance is very sensitive to packet losses and delayed packets. Specifically, the aggressive back-off behaviour of TCP may results in underutilisation of links and increased packets delay. A very recent study by MIT researchers suggests a possible 16-fold throughput improvement in networks by modifying TCP behaviour. FIG. 1 shows an example of TCP performance in terms of achievable throughput versus packet loss. As illustrated, the throughput drops significantly with small packets' drop rates (that are usual in most networks).

The increased latency as the result of TCP back-off behaviour can be particularly problematic when considering cloud-based services where service level agreement (SLA) violations may result in financial penalties for the cloud provider. Unfortunately, such excessive delays occur more frequently when there is congestion in the network and that's exactly when TCP effects appear most. In addition to congestion, with the significant increase of mobile data usage, wireless links are becoming integrated part of most end-to-end communications. Wireless channels normally result in higher packet drops and hence TCP is known to be very sub-optimal choice for wireless channels (hence protocols such as wireless access protocol (WAP) have their own transport protocol, wireless transfer protocol (WTP)).

As explained above, TCP that is the most common transport protocol that suffers from increased latency as a result of aggressive back-offs as well as bandwidth underutilisation. User Datagram Protocol (UDP), on the other hand, is a transport protocol which does not provide any guarantee on the reliability of the packets' delivery process. Using traditional fixed rate error correction codes is inefficient to combat packet drops (whole packet erasures). Additionally, packet-level error correction codes results in trade-off of bandwidth and reliability and may result in unnecessary utilisation of bandwidth by Forward Error Correction (FEC) codes. Hybrid Automatic Repeat-reQuest (ARQ) techniques in general are more efficient but their performance significantly depends on optimality of the parameters and reliability of the feedback channels.

Despite these negatives, TCP is still recognised for its performance reliability. Accordingly, any other alternative solution should assure reliability of packet delivery without significant bandwidth overheads. As will be explained, rateless code based transport protocol is an efficient way to assure reliability while minimising latency. The end to end protocol has been implemented and measurements indicate that there is a 4-fold throughput improvement (over wired links and up to 11-fold over wireless links) when using this transport protocol instead of TCP. These significant improvement gains are in-line with the quantities observed by other very recent research reports.

In addition to the latency, security and, more particularly, data confidentiality is another major concern for wide deployment of many cloud services. As a by-product of this transport control protocol, confidentiality of data when transmitted over untrusted links (for example, a public network) can be guaranteed.

However, as it will be explained, despite significant performance superiority over TCP, the rateless code based transport protocol suffers from a problem related to receiving old and on-the-fly or transiting packets.

Accordingly, a receiver node may be provided. The receiver node may receive rateless encoded data packets from a transmitter node. The receiver node may comprise estimation logic which estimates a number of rateless encoded data packets which may transit between the receiver node and the transmitter node. As will become clear from the description below, it will be appreciated that this transiting number is not simply the instantaneous number of data packets transiting at any one time. The receiver node may also comprise determining logic which determines an acknowledgement number of received rateless encoded data packets. The acknowledgement number may be determined from a decoding number of rateless encoded data packets and the transiting number of rateless encoded data packets. The decoding number of rateless encoded data packets may be that number which is estimated to be required from a batch of rateless encoded data packets to enable that batch of rateless encoded data packets to likely be fully decoded. The acknowledgement number may be determined to be the difference between the decoding number of rateless encoded data packets and the transiting number of rateless encoded data packets. The receiver node may also comprise acknowledgement logic which transmits an acknowledgement to the transmitter node when the number of received rateless encoded data packets achieves the acknowledgement number of received rateless encoded data packets.

Through this approach, it is possible to anticipate when it is safe to transmit an acknowledgement message to the transmitter to cause a transmitter to cease transmission of rateless encoded data packets from the batch, even though the receiver node has not yet fully decoded all of the data packets within that batch. This is possible because an estimation has been made of the number of transiting data packets that would subsequently be received by the receiver node. If the receiver node had instead waited until the received rateless encoded data packets had been decoded before sending the acknowledgement, additional on-the-fly rateless encoded data packets will have been sent and will transit to the receiving node which are not required for decoding and which results in a waste of resources. However, by sending the acknowledgement early, in the knowledge that sufficient rateless encoded data packets will be transmitted before the acknowledgement is received by the transmitting node, the correct number of data packets will still be received by the receiving node to enable the batch to likely be fully decoded.

In one embodiment, the acknowledgement number of received rateless encoded data packets comprises the decoding number of rateless encoded data packets less the transiting number of rateless encoded data packets.

In one embodiment, the determining logic is operable to determine the decoding number of rateless encoded data packets by determining a number of rateless encoded data packets calculated as being required to be received to provide a selected probability of successful decoding of the batch. Accordingly, the decoding number may be calculated based on a selected probability of successfully decoding the batch with that number of rateless encoded data packets. In particular, it is possible to mathematically determine a number of data packets required to be received in order to achieve a particular probability of decoding all of the data packets within a batch. For example, it is possible to determine the number of data packets required in order to achieve a 90, 95, 98, 99%, etc. probability of being able to decode the batch.

In one embodiment, the determining logic is operable to determine the decoding number of rateless encoded data packets by determining the number of rateless encoded data packets calculated as being required to be received to provide the selected probability of successful decoding of the batch based on encoding parameters selected for the rateless encoded data packets. Again, it is possible to determine the number of data packets required to achieve any particular probability based on the encoding parameters used for the rateless encoding of the data packets.

In one embodiment, the determining logic is operable to receive the encoding parameters from the transmitter node. Accordingly, the transmitter node may transmit the encoding parameters to the receiver node to enable the receiver node to perform that probability calculation.

In one embodiment, the determining logic is operable to receive the encoding parameters from the transmitter node.

In one embodiment, the determining logic is operable to set the encoding parameters for use by the transmitter node to adjust a probability distribution of successful decoding. Accordingly, the receiver node may also determine a set of encoding parameters which achieve a particular probability distribution required by the receiver node.

In one embodiment, the determining logic is operable to transmit a request for a change in the encoding parameters to the transmitter node. Accordingly, the receiver node may request that the transmitter node change its encoding parameters to those more suited to the receiver node.

In one embodiment, the estimation logic is operable to determine the transiting number of rateless encoded data packets by determining how many rateless encoded data packets from the batch are received following the acknowledgement being transmitted to the transmitter node. Accordingly, the receiver node may count the number of rateless encoded data packets received following transmission of the acknowledgement in order to determine the transiting number of rateless encoded data packets. It can be seen that the transiting number may therefore not only include the actual number in transit at any one time, but may also include those data packets which continue to be transmitted following transmission of the acknowledgement, but before the acknowledgement is received and acted upon by the transmitter node.

In one embodiment, the estimation logic is operable to update the transiting number of rateless encoded data packets following each acknowledgement transmitted to the transmitter node. Accordingly, each time the acknowledgement is sent, the transiting number of rateless encoded data packets may be determined. This series of transiting number of rateless encoded data packets may be used collectively in order to determine an average transiting number.

In one embodiment, the estimation logic is operable to update the transiting number of rateless encoded data packets following each acknowledgement transmitted to the transmitter node using a moving window average function.

In one embodiment, the determining logic is operable to adjust the acknowledgement number of received rateless encoded data packets by an estimation error number of received rateless encoded data packets. Accordingly, a fixed margin of error may be applied to the decoding number in order to account for slight variations.

In one embodiment, the acknowledgement logic is operable, when the receiver node is unable to decode the received rateless encoded data packets from a batch, to transmit a request indication to the transmitter node requesting more rateless encoded data packets be transmitted from the batch. Accordingly, when, as will be statistically the case, the receiver node is unable to decode the batch from the received rateless encoded data packets, a request indication may be transmitted to the transmitter node requesting that more rateless encoded data packets from that batch be transmitted.

In one embodiment, the request indication indicates at least one of those rateless encoded data packets from the batch which remain undecoded and a selected number of those rateless encoded data packets from the batch which remain undecoded which enable all rateless encoded data packets from the batch to be decoded. Accordingly, the indication may indicate all of those rateless encoded data packets which still remain unencoded, or may indicate those rateless encoded data packets from which all the remaining undecoded rateless encoded data packets may be decoded.

In one embodiment, the acknowledgement logic is operable, when the receiver node decodes the received number of received rateless encoded data packets from a batch, to transmit a decode indication to the transmitter node. Hence, the receiver node may indicate to the transmitter node that a batch has been successfully decoded.

According to a second aspect, there is provided a receiver node method comprising: estimating a transiting number of rateless encoded data packets transiting between the receiver node and a transmitter node; determining an acknowledgement number of received rateless encoded data packets, the acknowledgement number of received rateless encoded data packets comprising a difference between a decoding number of rateless encoded data packets estimated to be required from a batch of rateless encoded data packets to decode the rateless encoded data packets from the batch and the transiting number of rateless encoded data packets; and transmitting an acknowledgement to the transmitter node to cause the transmitter node to cease transmission of rateless encoded data packets from the batch of rateless encoded data packets when a received number of received rateless encoded data packets from the batch of rateless encoded data packets achieves the acknowledgement number of received rateless encoded data packets.

In one embodiment, the acknowledgement number of received rateless encoded data packets comprises the decoding number of rateless encoded data packets less the transiting number of rateless encoded data packets.

In one embodiment, the step of determining comprises determining the decoding number of rateless encoded data packets by determining a number of rateless encoded data packets calculated as being required to be received to provide a selected probability of successful decoding of the batch.

In one embodiment, the step of determining comprises determining the decoding number of rateless encoded data packets by determining the number of rateless encoded data packets calculated as being required to be received to provide the selected probability of successful decoding of the batch based on encoding parameters selected for the rateless encoded data packets.

In one embodiment, the method comprises receiving the encoding parameters from the transmitter node.

In one embodiment, the method comprises setting the encoding parameters for use by the transmitter node to adjust a probability distribution of successful decoding.

In one embodiment, the method comprises transmitting a request for a change in the encoding parameters to the transmitter node.

In one embodiment, the step of estimating comprises determining the transiting number of rateless encoded data packets by determining how many rateless encoded data packets from the batch are received following the acknowledgement being transmitted to the transmitter node.

In one embodiment, the method comprises updating the transiting number of rateless encoded data packets following each acknowledgement transmitted to the transmitter node.

In one embodiment, the method comprises updating the transiting number of rateless encoded data packets following each acknowledgement transmitted to the transmitter node using a moving window average function.

In one embodiment, the method comprises adjusting the acknowledgement number of received rateless encoded data packets by an estimation error number of received rateless encoded data packets.

In one embodiment, the method comprises transmitting a request indication to the transmitter node requesting more rateless encoded data packets from the batch when the receiver node is unable to decode the received rateless encoded data packets from a batch.

In one embodiment, the request indication indicates at least one of those rateless encoded data packets from the batch which remain undecoded and a selected number of those rateless encoded data packets from the batch which remain undecoded which enable all rateless encoded data packets from the batch to be decoded.

In one embodiment, the method comprises transmitting a decode indication to the transmitter node when the receiver node decodes the received number of received rateless encoded data packets from a batch.

According to a third aspect, there is provided a transmitter node operable to transmit rateless encoded data packets to a receiver node, the transmitter node comprising: transmission logic operable to transmit rateless encoded data packets from a batch of rateless encoded data packets; reception logic operable, on receipt of an acknowledgement from the receiver node, to cease transmission of rateless encoded data packets from the batch of rateless encoded data packets to which the acknowledgement relates and to temporarily store the batch of rateless encoded data packets.

Hence, rather than simply discarding the batch, the transmitter node may temporarily store the batch in case further rateless encoded data packets are required.

In one embodiment, the transmission logic is operable, following receipt of the acknowledgement, to transmit rateless encoded data packets from another batch of rateless encoded data packets.

In one embodiment, the transmission logic is operable to transmit encoding parameters used to encode the rateless encoded data packets to the receiver node.

In one embodiment, the reception logic is operable receive encoding parameters from the receiver node for use by the transmission logic when transmitting the rateless encoded data packets.

In one embodiment, the reception logic is operable to receive a request indication from the receiver requesting more rateless encoded data packets be transmitted from the batch and the transmission logic is operable to transmit more rateless encoded data packets from the batch of rateless encoded data packets.

In one embodiment, the request indication indicates at least one of those rateless encoded data packets from the batch which remain undecoded and a selected number of those rateless encoded data packets from the batch which remain undecoded which enable all rateless encoded data packets from the batch to be decoded.

In one embodiment, the reception logic is operable to receive a decode indication from the receiver node and to delete the temporarily stored batch of rateless encoded data packets.

According to a fourth aspect, there is provided a transmitter node method, comprising: transmitting rateless encoded data packets from a batch of rateless encoded data packets; and on receipt of an acknowledgement from the receiver node, ceasing transmission of rateless encoded data packets from the batch of rateless encoded data packets to which the acknowledgement relates and temporarily storing the batch of rateless encoded data packets.

In one embodiment, the method comprises, following receipt of the acknowledgement, transmitting rateless encoded data packets from another batch of rateless encoded data packets.

In one embodiment, the method comprises transmitting encoding parameters used to encode the rateless encoded data packets to the receiver node.

In one embodiment, the method comprises receiving encoding parameters from the receiver node for use when transmitting the rateless encoded data packets.

In one embodiment, the method comprises receiving a request indication from the receiver requesting more rateless encoded data packets be transmitted from the batch and transmitting more rateless encoded data packets from the batch of rateless encoded data packets.

In one embodiment, the request indication indicates at least one of those rateless encoded data packets from the batch which remain undecoded and a selected number of those rateless encoded data packets from the batch which remain undecoded which enable all rateless encoded data packets from the batch to be decoded.

In one embodiment, the method comprises receiving a decode indication from the receiver node and deleting the temporarily stored batch of rateless encoded data packets.

According to a fifth aspect, there is provided a computer program product operable, when executed on a computer, to perform the method steps of the first or fourth aspect.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present invention will now be described further, with reference to the accompanying drawings, in which:

FIG. 3 illustrates a schematic example comparing TCP and a transmission scheme based on rateless codes;

FIGS. 4a and 4b illustrates an example histogram of the actual number of rateless coded packets required to successfully decode 10,000 original packets for two different coding strategies;

DESCRIPTION OF THE EMBODIMENTS

Overview

Figure 1:
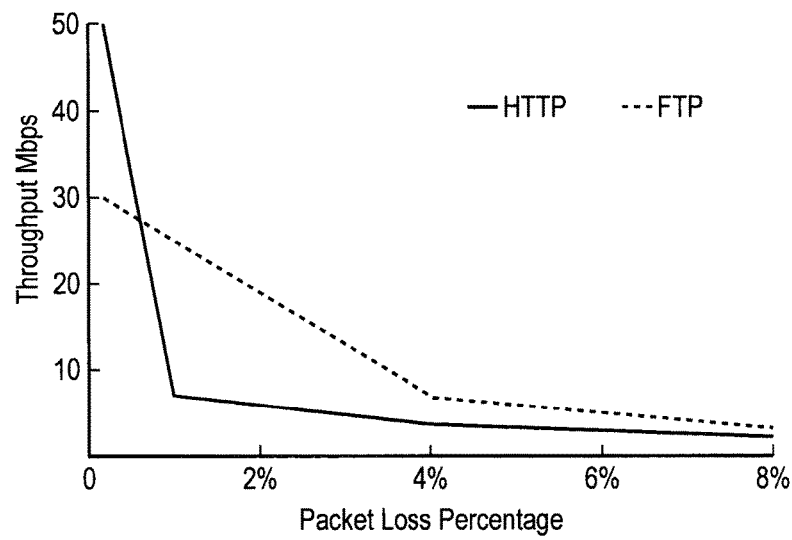
FIG. 1 illustrates an example of TCP performance.

Before discussing the embodiments in any more detail, first an overview will be provided. Embodiments recognise that an inefficiency occurs in conventional techniques for rateless encoding. Conventionally, an acknowledgement is only sent once the receiver has fully decoded all of the batch of rateless encoded data packets transmitted by a transmitter. However, this approach leads to more rateless encoded data packets being transmitted than are required, since the transmitter continues to transmit rateless encoded data packets until the acknowledgement is received from the receiver. This leads to additional rateless encoded data packets being in transit between the transmitter and receiver from the time that the acknowledgement is sent until it is received by the transmitter. This problem is exacerbated in situations where the communications path between the transmitter and the receiver is long.

Accordingly, embodiments provide an arrangement where the acknowledgement signal is sent early. This is possible because the receiving node makes an assessment of the excess number of transiting data packets that will be received following transmission of the acknowledgement signal to the transmitter. Using that information, together with an assessment of the probability of being able to decode a batch following receipt of a particular number of rateless encoded data packets, it is possible to determine a number of rateless encoded data packets received after which the acknowledgement signal can be sent in the knowledge that the transiting number of data packets will still be received which, together with the number of received data packets at the time when the acknowledgement was sent, will together enable the batch to be fully decoded with a selected probability. This helps to minimise any redundant rateless encoded data packets from being transmitted.

Rather than then simply discarding the batch that has been transmitted, the transmitter node will instead store the batch temporarily until an indication is received from the receiver that the batch has been successfully decoded. If that indication is not received and the receiver indicates that additional rateless encoded data packets are required, then the transmitter can access these from the store and transmit these on to the receiver. If the number of missing data packets is low, then the transmitter may also choose to transmit these without using rateless encoding, if it is more efficient to do so.

End-to-end rateless code based packet transport protocol according to embodiments have been implemented and compared to the traditional TCP protocol. During the measurements, throughput improvements of up to 4-times for wired networks and up to 11-fold for hybrid wired and wireless networks were observed. Embodiments provide a mechanism to overcome an issue related to receiving old/on-the-fly packets after an acknowledgment packet is sent, and thereby improves network efficiency. Embodiments are based on estimating the number of packets on-the-fly (those packets in transit between a transmitting node and a receiving node—this number can be estimated accurately) and using coding parameters to estimate the number of required packets to be received by a receiving node prior to transmitting an acknowledgement. In addition, in case the received packets received by the receiving node are not sufficient for full decoding of data, embodiments provide a mechanism to request additional packets. In order to aide understanding, detailed descriptions are given after providing background information on functionality of rateless codes.

Overview of Rateless Codes

The rudimentary principles of the encoding and decoding techniques of rateless coding for transmission over erasure channels will now be described. Luby transform (LT) codes are the first practical realization of rateless codes and can be used to explain the principles of rateless codes (although it will be appreciated that many other implementations/variants are possible).

Encoding Procedure

Assume a data message consisting of K input (source) symbols $v=[v_1\ v_2\ \ldots\ v_K]$, with each symbol containing an arbitrary number of bits. The terminology used in rateless codes refers to the original data message v as a "file". Consider a hypothetical example of a data message containing four two-bit symbols given by the vector $v=[00\ 10\ 11\ 01]$.

Subsequently, the LT-encoded symbols $c=[c_j], 2\ j=1, \ldots, N$, is simply the modulo-2 sum (i.e., the eXclusive OR (XOR)) of $d_c$ distinct input symbols, chosen uniformly at random. The actual $d_c$-value of each symbol to be encoded is then chosen from a pre-defined distribution $f(d_c)$, which is also sometimes referred to as the output distribution. Assume that the first dc-value sampled from $f(d_c)$ is 2. Consequently, two input symbols will be chosen at random from v. Assume that the two selected source symbols correspond to the first and second symbol in v. In such a case, $c_1$ will be calculated as $00 \otimes 10=10$, where "$\otimes$" denotes the XOR function.

The encoding algorithm proceeds in the same manner, each time selecting a dc-value sampled pseudo-randomly from $f(d_c)$ and then calculating the encoded symbol according to the XOR product of a dc-number of pseudo-randomly selected source symbols. The encoded symbols may be referred to as the "LT-encoded packets" due to the natural applicability of LT codes to the communication channels.

Figure 2:
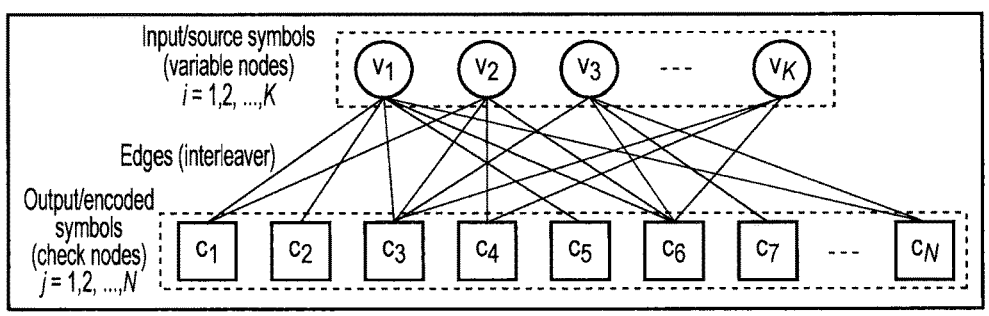
FIG. 2 illustrates a bipartite-graph-based description of a Luby theorem code.

The connection between the input and output symbols can also be diagrammatically represented by means of a bipartite graph, as shown in FIG. 2. Using graph-related terminology, the input source symbol may be referred to as a variable node, while the LT-encoded symbol can be regarded as a check node. The number of edges emerging from each check node corresponds to the dc-value sampled from $f(d_c)$ and for this reason, dc is sometimes referred to as the check degree.

FIG. 2 illustrates a bipartite-graph-based description of an LT code showing the source symbols (variable nodes) and the LT-encoded symbols (check nodes). The symbols can be of an arbitrary size. For instance, $c_4$ is calculated by the modulo-2 sum (XOR product) of $v_2$ and $v_K$ in the specific example portrayed in this bipartite graph.

Decoding Procedure

Now consider an erasure channel, in which encoded symbols of c are erased during the ensuing transmission. Simplistically speaking, the task of the decoder is that of recovering the erased symbols from the unerased ones. The decoding process commences by locating a degree-one input symbol; i.e., a symbol that is not XOR-combined with any other. The decoder will then modulo-2 add the value of this symbol to all the LT-encoded symbols relying on it and then removes the corresponding modulo-2 connections, where each connection is represented by an edge on the associated bipartite graph (see FIG. 2). The decoding procedure continues in an iterative manner, each time starting from a degree-one symbol.

Rateless Codes with Feedback

According to the above description, and with an efficient implementation, any N original packets can be decoded using any N rateless coded packets with a high probability (in practice there is normally a marginal overhead). This is particularly important since it removes the requirement for the sender to retransmit a data packet that is dropped or received with uncorrectable errors (if error correction codes are in use). Instead, the sender can continue transmitting rateless coded packets until N packets are received. At this point, the receiver can send a single acknowledgment packet to allow the sender to move on to the next group of packets. This can significantly improve the latency of the transmission compared to TCP (particularly under congestion conditions when the TCP congestion window is small).

FIG. 3 shows a schematic example comparing TCP (with CWND=1 in this example) and a transmission scheme based on rateless codes.

In this scheme, first, the number of packets involved in each batch shoo d be decided and communicated with the receiver. This rateless code based transport protocol will be very similar to the User Datagram Protocol (UDP), in that the transmitter will send data packets consequently. However, once enough correct packets are received at the receiver side, it will send an acknowledgment and the transmitter can move on to the next batch. If the size of the batch is changed, it should be communicated with the receiver. It should be noted that all rateless coded packets contain mapping information in respect to the original packets. In FIG. 3, for example, RS Pkt 1 might be result of the XOR operation of original packets 5 and 3. Since each batch of rateless coded packets covers a certain range of original packets, the receiver can easily tell each received packets belongs to which batch. Optionally, each packet can contain the batch ID.

In addition, due to the randomness nature of the rateless coding, it is possible that some coded packets are duplicated or some specific packets are missing in a given number of coded packets. Therefore, in practice some overhead may be required in order to assure successful decoding of rateless codded packets. Fortunately, this overhead is marginal (1-8%). The actual overhead depends on the coding parameters. For example, with existing coding methods, it is possible to choose coding parameters such that the mean of the overhead is small with larger variance or instead use a strategy that requires higher overheads on average but with lower variance.

FIGS. 4a and 4b show an example histogram of the actual number of rateless coded packets required to successfully decode 10,000 original packets for two different coding strategies. FIG. 4a shows the case where the average number of required packets is smaller but the variance is higher than the case in FIG. 4b.

Performance of the Rateless Code Based Transport Protocol

To examine the feasibility and to evaluate the performance gains of the transport protocol based on rateless codes of embodiments, the full the end-to-end transport solution has been implemented. Compared to the traditional TCP-based transport, embodiments provide a throughput gain of about 4-times when considering wired links and up to 11-times when the communication path consists of wireless links. Such enormous gains are very promising, making the adoption of this scheme to be likely.

Figure 5:
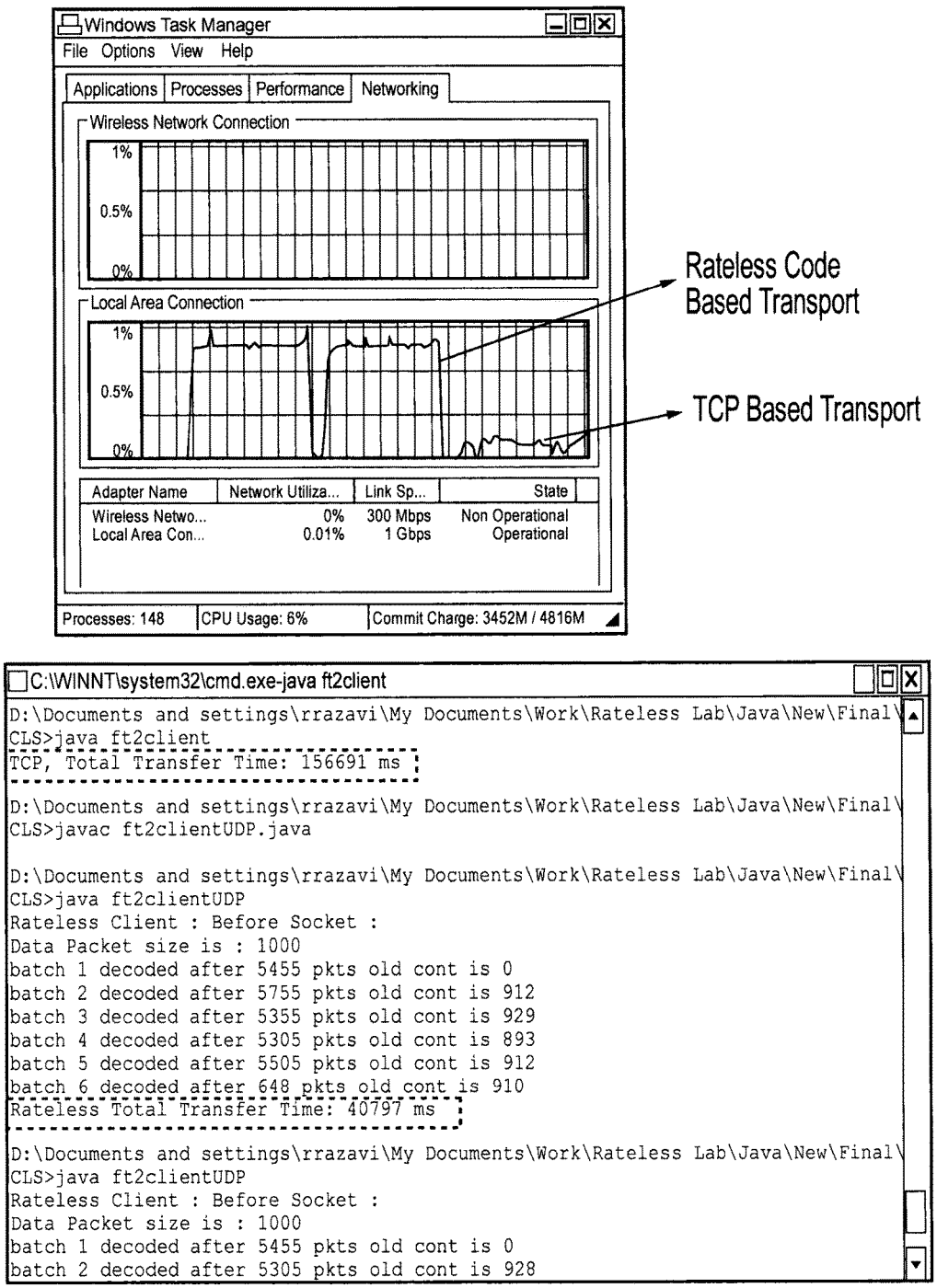
FIG. 5 illustrates some snapshots comparing the TCP-based data transport with the scheme for a wired communication scenario of embodiments.

FIG. 5 shows some snapshots comparing the TCP-based data transport with the scheme for a wired communication scenario of embodiments. In this example, a file transfer was used as a case study for comparison of throughput of the two schemes.

Transiting Packets

As explained earlier, for rateless code protocols where feedback is available, the receiver sends the acknowledgment packet after receiving enough packets such that it can fully decode the batch. However, considering a long communication path distance or high capacity links (also known as FAT links), there will be high number of on-the-fly packets (those still in transit between the transmitter and receiver) when the acknowledgment packet is sent. By the time the acknowledgment packet is received by the sender, even more packets related to the old batch have been sent. This results in a waste of bandwidth over the entire communication path, as well as reduced effective throughput.

In the example shown in FIG. 5, "Pkts old count" refers to the number of received packets belonging to the previous batch after successfully decoding the batch and sending the ACK packet. In this example, the batch size was set to 5000 Packets and it can be seen that expectedly different batches are decoded after receiving varying number of packets ranging from 5305 to 5755 (note that the last batch is not considered since it only covers the reminder of the file). In this case receiving 900 old packets means approximately 16% unnecessary overhead. This overhead would have been 160% if the batch size was 500 packets instead.

Since the number of on-the-fly is roughly fixed, the problem becomes more significant when the batch size is small (e.g. less than 100 packets). Unfortunately, many practical scenarios require the batch size to be small. This is, for example, the case when the receiver computation/memory space is very limited (that is needed for decoding) or when input packets' arrival rate is low. Moreover, in this example, the communication link was not very long, so effectively the number of on-the-fly packets could be much higher (for example, for inter-continental links).

Fortunately, as can be seen from FIG. 5, the number of on-the-fly packets is very consistent for a particular link (since all packets usually go through the same path in the network). This observation has been confirmed through various experiments.

Figure 6A:
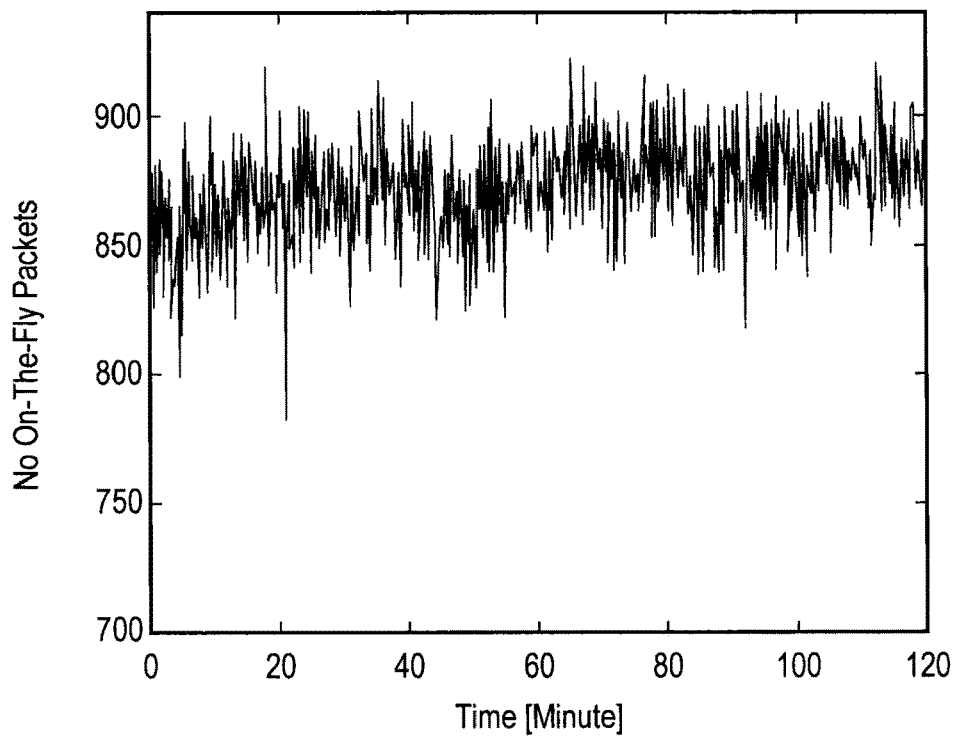
FIGS. 6a and 6b illustrate the result of capturing the number of on-the-fly packets over the time for an experiment that was conducted for 2 hours.

FIG. 6a shows the result of capturing the number of on-the-fly packets over the time for an experiment that was conducted for 2 hours. To get a better understanding, FIG. 5b illustrates the histogram of the distribution or Probability Distribution Function, Mean=873.01, Standard Deviation (STD)=19.23, Median absolute deviation (MAD)=13.

Transiting Packet Reduction

In order to avoid the unnecessary overhead related to the on-the-fly packets, a learning phase occurs during which the receiver can estimate the number of on-the-fly packets, N. The learning phase could consist of 1 or more batches from which the receiver can estimate the number of packets in transit. In addition, network congestion along the packets' delivery path may vary during the transmission and subsequently change the number of packets in transit. Therefore, it is useful to employ a form of moving-window averaging scheme that can provide a means of adaptive memory for the system giving more weight to the recent observation whilst removing the measurements' noise by averaging over past observations. Using an exponentially weighted moving average (EWMA), the estimated number of on-the-fly packets can be estimated as:

$$N_{Updated} \leftarrow (1-\alpha) \cdot N_{Old} + \alpha \cdot N_{new}$$

where, as the names imply, $N_{Updated}$ is the updated estimate of the number of on-the-fly packets, $N_{old}$ is the old estimation and $N_{new}$ refers to the new observation. $\alpha$ is the learning rate ranging from 0 to 1. Higher $\alpha$ values account more for recent observations.

Figure 7A:
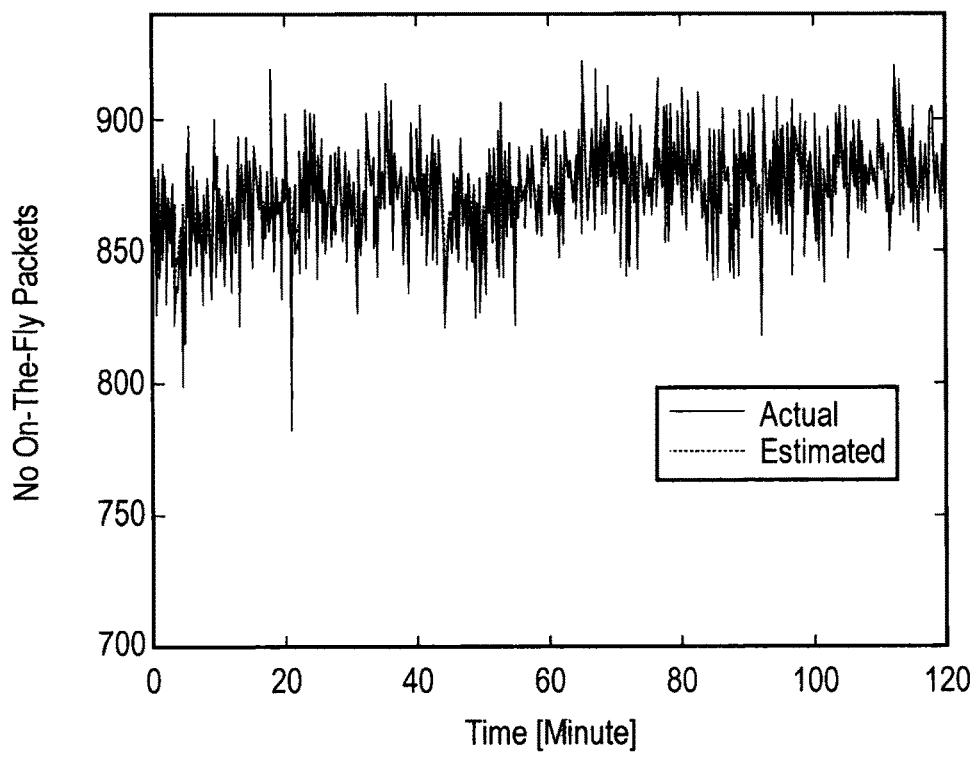
FIG. 7a illustrates the estimated number of on-the-fly packets compared to the actual values.
Figure 7B:
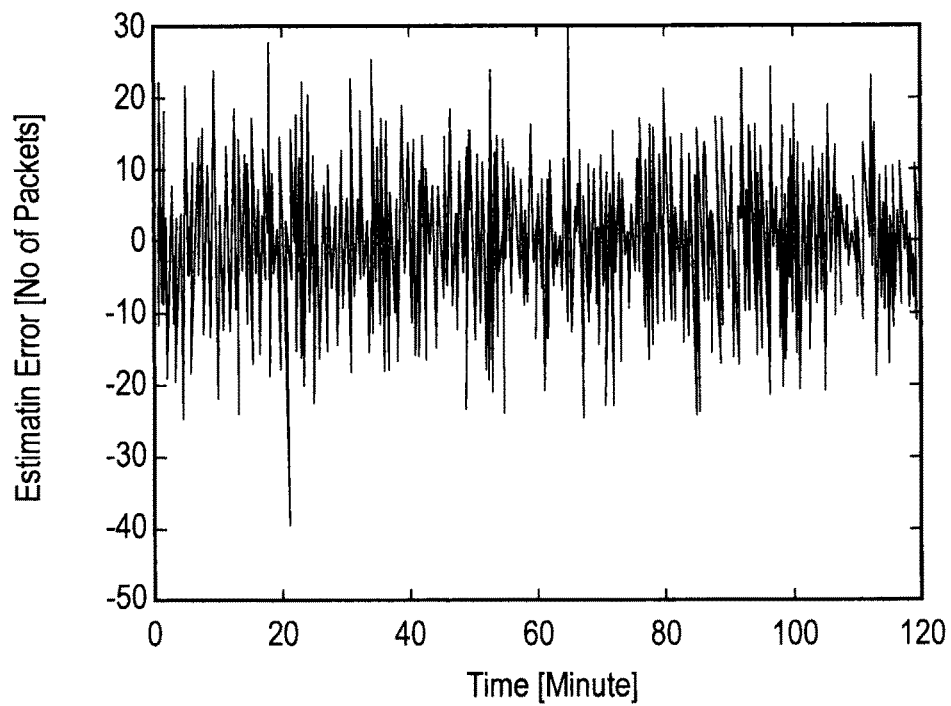
FIG. 7b illustrates the estimation error.

FIG. 7a shows the estimated number of on-the-fly packets (where $\alpha$ was set to 0.5) compared to the actual values. FIG. 7b illustrates the estimation error. As can be verified from FIG. 7b, the estimation error is marginal (in most cases below 20 Packets) and hence can be compensated by considering an estimation error margin, $E_m$.

Moreover, the transmitter and receiver should exchange the parameters of the coding before starting the transmission. If the coding parameters are exchanged, the receiver can estimate the overhead required to fully decode the data with a certain probability (See FIG. 4 as an example). For example, in the case of LT codes, the degree of coded packets (defined as the number of original packets included in each coded packet) is selected from a Robust Soliton (RS) distribution that is defined by two parameters known as $\delta$ and C in LT codes terminology. The Luby theorem gives the probability of successful decoding of packets after receiving a certain overhead ratio. More specifically, if the batch size is given, the expected number of degree-one packets within K coded packets, S, is $$S = C \ln\left(\frac{K}{\delta}\right)\sqrt{K}$$

According to the Luby main theorem, the expected number of packets needed to decode K original packets with the probability of 1-$\delta$ is given by $$K' = K + 2\ln\left(\frac{S}{\delta}\right)s$$

Figure 8:
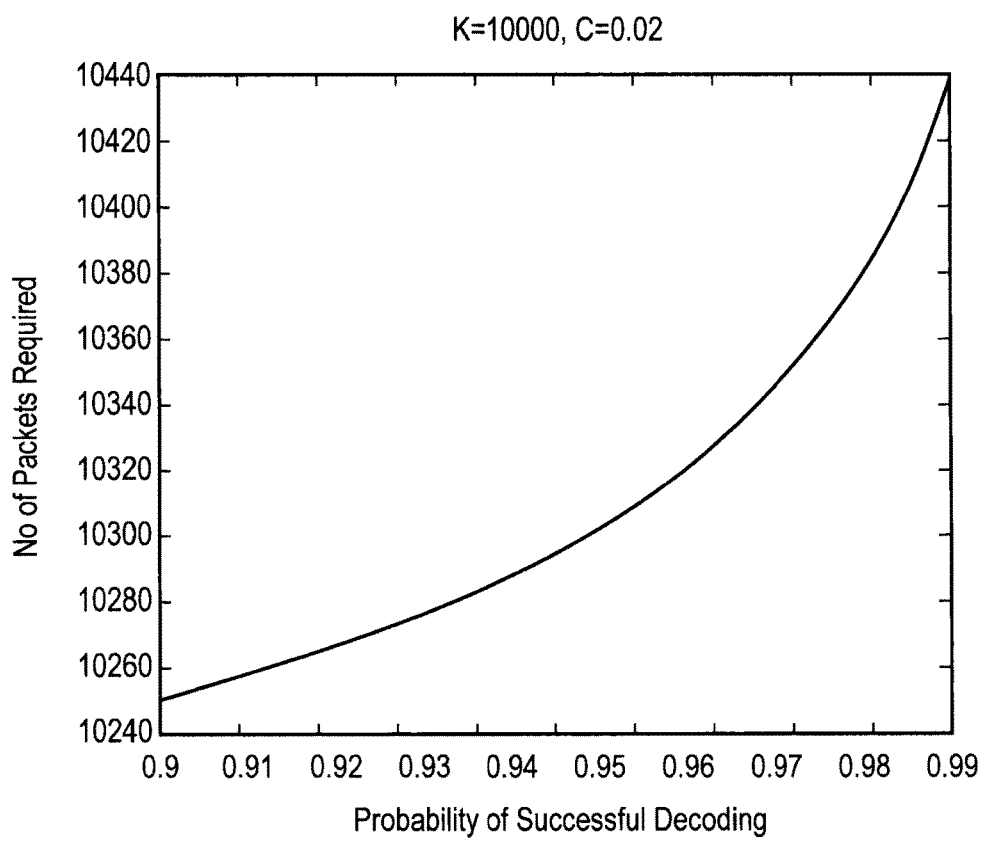
FIG. 8 illustrates an example detailing the number of required coded packets versus probability of successful decoding.

FIG. 8 shows an example detailing the number of required coded packets versus probability of successful decoding where K=10000 and C is set to 0.02. In this example, with 4.4% extra overhead (440 packets), the decoder will be able to decode a batch of 10000 packets with the probability of 99%. Similar curves can be obtained readily (either analytically or heuristically) for other variants of rateless codes. (K=10000 and C=0.02)

The receiver can then define a probability threshold, P, and find the number of packets required to assure successful decoding of the batch with that probability, $M_p$. A conservative receiver may choose a higher probability threshold. Subsequently, the receiver will send an acknowledgement packet when it receives ($M_p+E_m-N_{Updated}$) packets. This way, the receiver should be able to fully decode the batch with a high probability (P) after receiving all of the on-the-fly packets.

Figure 6B:
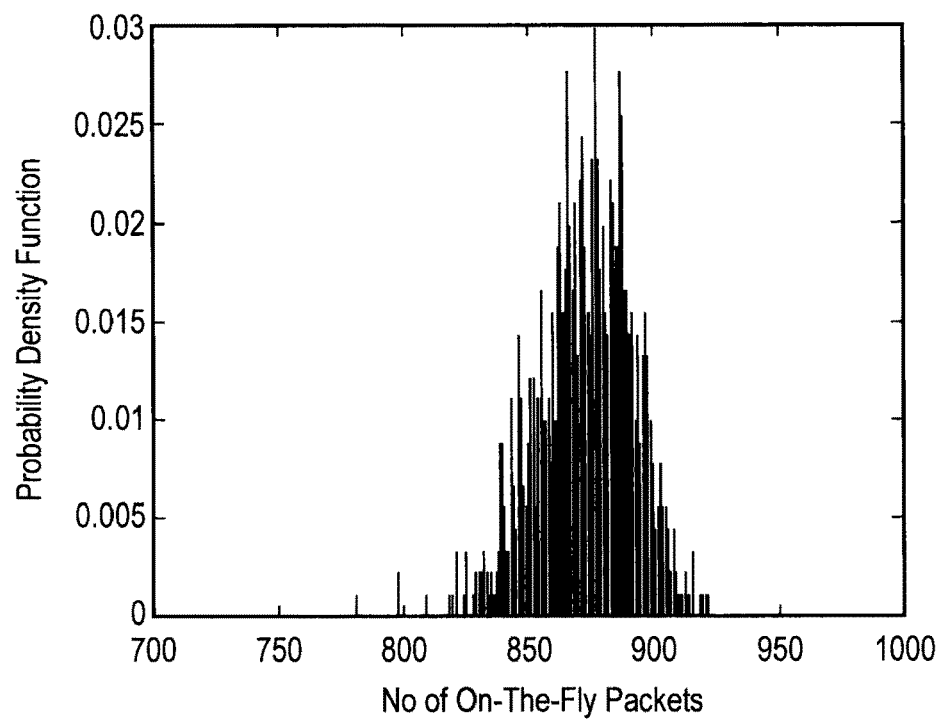

Consider the example shown in FIG. 6, if the receiver wants to guarantee successful decoding of packets of the batch (K=10000) with the probability of 99% (P), 10440 packets are required ($M_p$=10440). If the current estimates of on-the-fly packets is 860 packets ($N_{Updated}$), as an example, and the receiver consider 20 packets as a margin to compensate for potential estimation errors ($E_m=20$), it should send the acknowledgment packet after receiving 9600 (=10440+20−860) packets.

The receiver continuously monitors to the number of on-the-fly packets and adjusts the timing for the acknowledgement packet such that, on average, the selected safety margin is maintained (for example, 20 on-the-fly packets).

Upon reception of the acknowledgement packet, the sender stores the original packets of the batch into a temporary buffer and immediately moves to the next batch and starts transmitting coded packets of that batch. Meanwhile, the receiver starts to decode the packets of the batch for which it had sent the acknowledgment. If packets of a new batch start to appear and the receiver is still unable to decode the previous batch, then it will send a Negative Acknowledgement (NACK) and request the sender to send more packets of the previous batch until the batch is fully decoded. However, this case should not occur frequently, since for majority of cases (e.g. 99%) the received packets are sufficient for full decoding. If the occurrence of decoding failures increases or decreases from the target value, the safety margin for on-the-fly packets is increased or decreased accordingly to compensate.

As one embodiment, in the case of an unsuccessful decoding attempt, the receiver can send the list of already decoded packets to the sender along with the NACK message. This will help the sender to avoid including already decoded packets when sending additional packets. Alternatively, the receiver can identify a list of key original packets that can be used to decode the rest of the non-decoded packets.

Moreover, the use of two types of ACK messages can be envisaged for each batch, the first being an ACK packet indicating that the receiver has received a certain number of packet that it believes (together with the on-the-fly packets that haven't arrived yet) will be sufficient for decoding the batch and the second ACK that indicates that the batch was successfully decoded. The sender will move on to the next batch upon reception of the first ACK message, but will store the batch data in a temporary buffer. Once the second ACK message is received the temporary buffer space will be cleared.

It will be appreciated that security and uncontrolled latencies are the two major concerns for data when it comes to the cloud computing deployments. Using the rateless code transport protocol, the latency is shown to be significantly improved compared to TCP. Additionally, since rateless packets are encoded, data encryption comes as a free by-product of the scheme. UDP does not grantee successful delivery of data packets and hence is not used for wide range of applications where reliability is strictly required. TCP, on the other hand, is a decades-old transport protocol which is very inefficient especially over long and high bandwidth pipes.

As mentioned above, one of the main issues in using the rateless code based transport protocol is the waste of bandwidth as a result of on-the-fly packets. This is very problematic when the batch sizes are forced to be small or when there is a high latency, high bandwidth link (FAT links) involved. Since the number of on-the-fly packets shown to be consistent (at least over long enough time frames), it can be estimated readily. Subsequently, embodiments provide an efficient way to enable the use of rateless code based transport scheme regardless of the batch size or network topology. Significant potential performance gain as result of this scheme are provided.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

The functions of the various elements shown in the Figures, including any functional blocks labelled as "processors" or "logic", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" or "logic" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the Figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. A receiver node operable to receive rateless encoded data packets from a transmitter node, said receiver node comprising:

estimation logic operable to estimate a transiting number of rateless encoded data packets transiting between said receiver node and said transmitter node;

determining logic operable to determine an acknowledgement number of received rateless encoded data packets, said acknowledgement number of received rateless encoded data packets comprising a difference between a decoding number of rateless encoded data packets estimated to be required from a batch of rateless encoded data packets to decode said rateless encoded data packets from said batch and said transiting number of rateless encoded data packets; and acknowledgement logic operable to transmit an acknowledgement to said transmitter node to cause said transmitter node to cease transmission of rateless encoded data packets from said batch of rateless encoded data packets when a received number of received rateless encoded data packets from said batch of rateless encoded data packets achieves said acknowledgement number of received rateless encoded data packets, wherein said determining logic is operable to determine said decoding number of rateless encoded data packets by determining a number of rateless encoded data packets calculated as being required to be received to provide a selected probability of successful decoding of said batch, wherein said determining logic is operable to determine said decoding number of rateless encoded data packets by determining said number of rateless encoded data packets calculated as being required to be received to provide said selected probability of successful decoding of said batch based on encoding parameters selected for said rateless encoded data packets.

2. The receiver node of claim 1, wherein said acknowledgement number of received rateless encoded data packets comprises said decoding number of rateless encoded data packets less said transiting number of rateless encoded data packets.

3. The receiver node of claim 1, wherein said determining logic is operable to receive said encoding parameters from said transmitter node.

4. The receiver node of claim 3, wherein said determining logic is operable to transmit a request for a change in said encoding parameters to said transmitter node.

5. The receiver node of claim 4, wherein said estimation logic is operable to determine said transiting number of rateless encoded data packets by determining how many rateless encoded data packets from said batch are received following said acknowledgement being transmitted to said transmitter node.

6. The receiver node of claim 5, wherein said estimation logic is operable to update said transiting number of rateless encoded data packets following each acknowledgement transmitted to said transmitter node.

7. The receiver node of claim 6, wherein said acknowledgement logic is operable, when said receiver node is unable to decode said received rateless encoded data packets from a batch, to transmit a request indication to said transmitter node requesting more rateless encoded data packets be transmitted from said batch.

8. The receiver node of claim 7, wherein said request indication indicates at least one of those rateless encoded data packets from said batch which remain undecoded and a selected number of those rateless encoded data packets from said batch which remain undecoded which enable all rateless encoded data packets from said batch to be decoded.

9. The receiver node of claim 8, wherein said acknowledgement logic is operable, when said receiver node decodes said received number of received rateless encoded data packets from a batch, to transmit a decode indication to said transmitter node.

10. A receiver node method comprising:

estimating a transiting number of rateless encoded data packets transiting between said receiver node and a transmitter node;

determining an acknowledgement number of received rateless encoded data packets, said acknowledgement number of received rateless encoded data packets comprising a difference between a decoding number of rateless encoded data packets estimated to be required from a batch of rateless encoded data packets to decode said rateless encoded data packets from said batch and said transiting number of rateless encoded data packets; and transmitting an acknowledgement to said transmitter node to cause said transmitter node to cease transmission of rateless encoded data packets from said batch of rateless encoded data packets when a received number of received rateless encoded data packets from said batch of rateless encoded data packets achieves said acknowledgement number of received rateless encoded data packets, wherein said determining an acknowledgment number includes determining said decoding number of rateless encoded data packets by determining a number of rateless encoded data packets calculated as being required to be received to provide a selected probability of successful decoding of said batch, wherein said determining an acknowledgement number includes determining said decoding number of rateless encoded data packets by determining said number of rateless encoded data packets calculated as being required to be received to provide said selected probability of successful decoding of said batch based on encoding parameters selected for said rateless encoded data packets.

11. A transmitter node operable to transmit rateless encoded data packets to a receiver node, said transmitter node comprising:

transmission logic operable to transmit rateless encoded data packets from a batch of rateless encoded data packets; and reception logic operable, on receipt of an acknowledgement from said receiver node, to cease transmission of rateless encoded data packets from said batch of rateless encoded data packets to which said acknowledgement relates and to temporarily store said batch of rateless encoded data packets, wherein the acknowledgement from said receiver node is sent in response to said receiver node determining a decoding number of rateless encoded data packets calculated as being required to be received to provide a selected probability of successful decoding of said batch, wherein the acknowledgement from said receiver node is sent in response to said receiver node determining said decoding number of rateless encoded data packets by determining said number of rateless encoded data packets calculated as being required to be received to provide said selected probability of successful decoding of said batch based on encoding parameters selected for said rateless encoded data packets.

12. A transmitter node method, comprising:
transmitting rateless encoded data packets from a batch of rateless encoded data packets; and
on receipt of an acknowledgement from a receiver node, ceasing transmission of rateless encoded data packets from said batch of rateless encoded data packets to which said acknowledgement relates and temporarily storing said batch of rateless encoded data packets,
wherein the acknowledgement from said receiver node is sent in response to said receiver node determining a decoding number of rateless encoded data packets calculated as being required to be received by said receiver node to provide a selected probability of successful decoding of said batch,
wherein the acknowledgement from said receiver node is sent in response to said receiver node determining said decoding number of rateless encoded data packets by determining said number of rateless encoded data packets calculated as being required to be received by said receiver node to provide said selected probability of successful decoding of said batch based on encoding parameters selected for said rateless encoded data packets.

13. A non-transitory computer readable medium containing program instructions for causing a computer to execute the method of claim 10.

* * * * *